(12) United States Patent
Cook et al.

(10) Patent No.: US 9,214,893 B2
(45) Date of Patent: Dec. 15, 2015

(54) STRING MONITOR

(75) Inventors: Martin Cook, Tigard, OR (US); Aaron Parker, Happy Valley, OR (US)

(73) Assignee: Veris Industries, LLC, Tualatin, OR (US)

( * ) Notice: Subject to any disclaimer, the term of this patent is extended or adjusted under 35 U.S.C. 154(b) by 765 days.

(21) Appl. No.: 13/483,236

(22) Filed: May 30, 2012

(65) Prior Publication Data
US 2013/0124122 A1 May 16, 2013

Related U.S. Application Data

(60) Provisional application No. 61/558,180, filed on Nov. 10, 2011.

(51) Int. Cl.
*H02S 50/10* (2014.01)
*G01R 19/165* (2006.01)

(52) U.S. Cl.
CPC ........... *H02S 50/10* (2014.12); *G01R 19/16538* (2013.01)

(58) Field of Classification Search
CPC ......... H02J 1/00; H02J 3/383; H02J 13/0003; H02J 13/0024; H02J 13/0062; Y02E 10/563; Y02E 60/74; Y02E 40/72; G01R 1/00
USPC .............. 307/43, 82; 702/60, 64; 340/870.01
See application file for complete search history.

(56) References Cited

U.S. PATENT DOCUMENTS

| | | | | |
|---|---|---|---|---|
| 6,184,656 B1* | 2/2001 | Karunasiri | ............ | B60L 3/0046 180/65.8 |
| 7,242,157 B1* | 7/2007 | Edel | ...................... | G01R 15/185 315/362 |
| 7,602,080 B1* | 10/2009 | Hadar | ...................... | H02J 3/385 307/19 |
| 2008/0147335 A1* | 6/2008 | Adest | ...................... | G01D 4/004 702/64 |
| 2008/0238195 A1* | 10/2008 | Shaver et al. | ................... | 307/18 |
| 2009/0140719 A1* | 6/2009 | Hasenfus | ........................ | 324/72 |
| 2010/0127848 A1* | 5/2010 | Mustapha et al. | ............ | 340/505 |
| 2010/0231042 A1* | 9/2010 | Weale | ............... | 307/38 |
| 2011/0073150 A1* | 3/2011 | Hightower | ............... | G05F 1/67 136/244 |
| 2011/0233995 A1* | 9/2011 | Nordstrom | .............. | B60R 16/03 307/9.1 |
| 2012/0053867 A1* | 3/2012 | Dunn et al. | ...................... | 702/58 |
| 2012/0081933 A1* | 4/2012 | Garrity | ............... | H02M 7/4807 363/37 |
| 2012/0316802 A1* | 12/2012 | Presher et al. | .................. | 702/58 |
| 2013/0026840 A1* | 1/2013 | Arditi | ....................... | H02J 1/10 307/77 |
| 2013/0026842 A1* | 1/2013 | Arditi | ....................... | H02J 1/10 307/82 |

* cited by examiner

*Primary Examiner* — John Breene
*Assistant Examiner* — Jeffrey Aiello
(74) *Attorney, Agent, or Firm* — Chernoff Vilhauer McClung & Stenzel, LLP

(57) ABSTRACT

A string monitor comprises a modular base unit and one or more sensor modules which may include sensor modules for measuring DC voltage and current.

16 Claims, 6 Drawing Sheets

STRING MONITOR

CROSS-REFERENCE TO RELATED APPLICATIONS

This application claims the benefit of U.S. Provisional App. No. 61/558,180, filed Nov. 10, 2011.

BACKGROUND OF THE INVENTION

The present invention relates to a device for monitoring electric power in a plurality of circuits and, more particularly, to a modular string monitor for monitoring DC current and/or voltage in a plurality of conductors.

Photovoltaics (PV) is the generation of electric power by converting solar radiation to direct current electric power with semiconductor material contained in a solar cell. A 100 square centimeter ($cm^2$) silicon solar cell produces about 2 Amps (A) at about 0.5 volts (v) when irradiated by 1000 Watts/square meter ($W/m^2$) sunlight. To obtain commercially useful electric power, multiple solar cells are electrically connected in series in a solar module or panel. Multiple solar modules are, in turn, connected electrically in series in groups called "strings" and the DC electricity output by a plurality of strings is combined in a combiner. The DC output of one or more combiners of a PV power generation site is transmitted to an inverter for conversion to alternating current (AC) power for powering local AC loads and/or transmission to a power grid.

The operation of a photovoltaic power generation site can be monitored at several levels. The AC output of the inverter(s) of the solar site is typically measured by site level monitoring. Site level monitoring may involve net or bi-directional metering to account for power obtained from the power grid when solar generation is inadequate to satisfy local demand and to account for power transmitted to the grid when excess solar generated power is available. Site level monitoring is relatively inexpensive, requiring only a single meter and addresses the commercial need to account for the power generated or consumed at a solar power site. However, site level monitoring is not particularly useful for monitoring the performance of a site or for identifying and rectifying problems that may arise. There are a variety of factors which can affect the output of a solar generating site and many, like cloud cover, are transient and local. This make it difficult to initially establish an expected output for the site and, when the site is operating, to recognize if a change in output is due to a problem with a portion of the array or one of the many other factors that can affect the site's output. With site level monitoring, a change of less 10% in the site's output may not be recognizable as indicating a problem with a portion of the array. Even if a problem with the array is suspected, troubleshooting typically involves costly selective dismantling and testing of portions of the array by skilled technicians because site level monitoring provides little assistance in localizing the problem.

An array level power meter monitoring the DC output of a combiner provides insight into the operation of the site's array. If a module is damaged or defective, the output of the string of which it is an element will be reduced and, as a result, the output of the combiner to which the string is connected will be reduced. An array level power meter is typically connected to a site control and monitoring system and the average output of one array level power meter is commonly used as a reference for other array level meters of the site. If the current or voltage output sensed by one of the array level meters varies from the output of the reference meter, the control system will alert the site operator and troubleshooting and repair can be initiated. While array level monitoring requires a monitor for each combiner of the site, site operation benefits from earlier problem detection and from more rapid and less costly identification of an underperforming portion of the array.

Monitoring the current, voltage or power of each string of an array enables rapid recognition of problems in the array by enabling comparison of the performance of a string with the performance of its neighbors or the string's theoretical performance calculated from measurement of the incident solar radiation and ambient temperature. In addition, the cost of troubleshooting, cleaning and repair can be substantially reduced by the ability to identify an underperforming string. However, string level monitoring can be expensive because at least one transducer is required for each of the many strings making up the site and the transducers for sensing DC current have heretofore been relatively expensive.

DC current can be monitored by a Hall effect device incorporated in a toroidal core of magnetic material. The conductor in which the current is to be measured is passed through the core and current flowing in the conductor produces fluctuations in the magnetic field in the core which are proportional to the current's magnitude. To determine the magnitude of the current in the conductor, the fluctuation of the magnetic field produced by the current is sensed by the Hall effect device and compared to a baseline magnetic field established when the transducer was calibrated. Hall effect DC current transducers are expensive and a current surge in the conductor can produce a magnetic field which can permanently alter the core so that the baseline is no longer accurate. Unless the device is recalibrated, any measurements made subsequent to the power surge will also be inaccurate.

DC current is also measurable with a fluxgate magnetometer typically comprising a "sense" or secondary coil surrounding an inner "drive" or primary coil that is wound around a magnetically permeable core. An alternating current is applied to the drive coil which alternately drives the core into plus or minus saturation. The constantly changing magnetic field induces an electric current in the sense coil which is measured by a transducer. When the core is exposed to an external magnetic field produced by an energized conductor, the core will be more easily saturated in alignment with the external field and less easily saturated in opposition to the external field and the difference in the strength of the magnetic field will be related to the magnitude of the current in the conductor. Fluxgate sensors and string monitors comprising multiple fluxgate sensors are also expensive.

What is desired, therefore, is a robust and less expensive string monitor for monitoring DC current and/or voltage in a plurality of conductors.

DETAILED DESCRIPTION OF PREFERRED EMBODIMENTS

Figure 1:
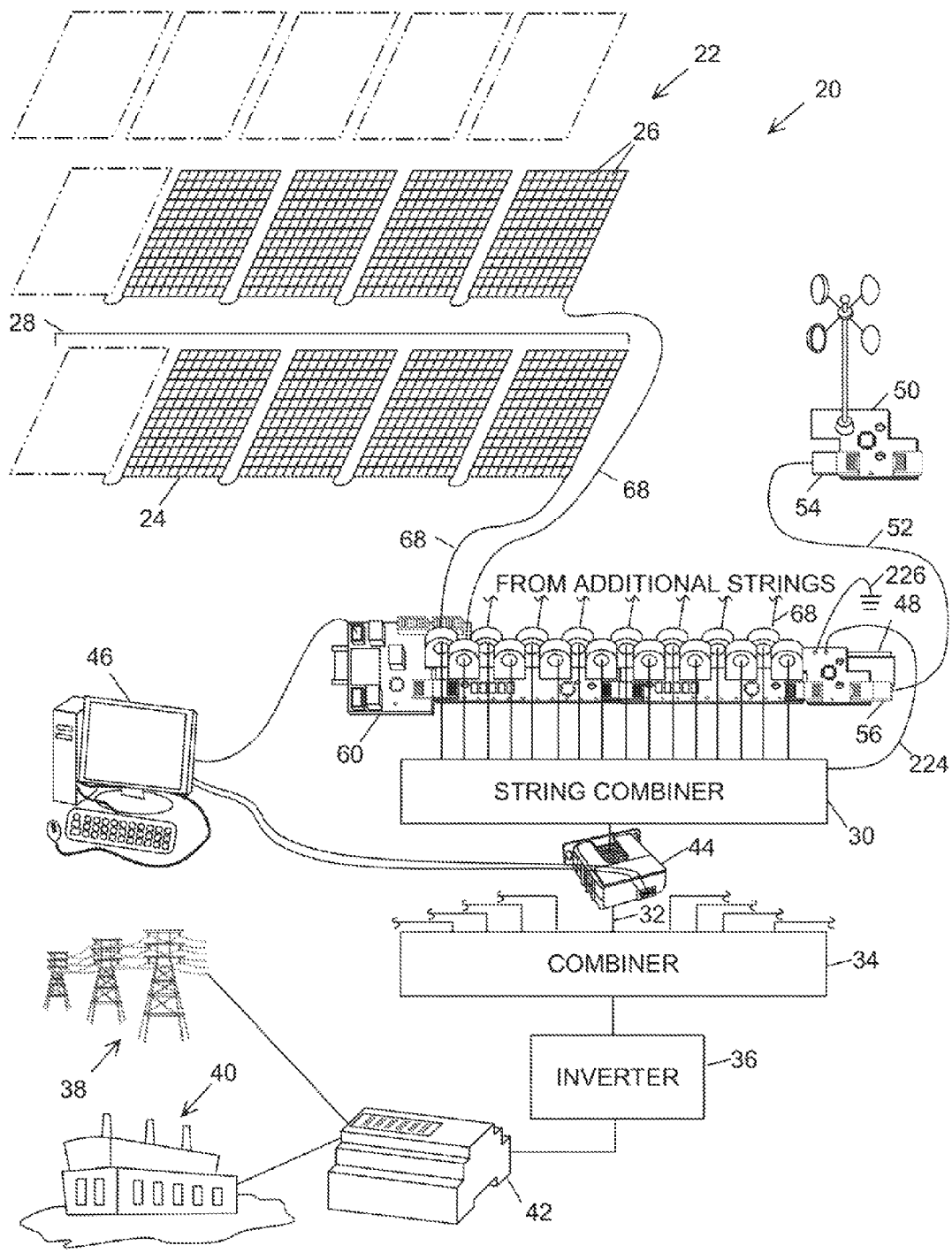
FIG. 1 is a block diagram of a photovoltaic solar power generation site including an exemplary string monitor.

Referring in detail to the drawings where similar parts are identified by like reference numerals, and, more particularly to FIG. 1, a solar electric power generation system or site 20 includes a solar array 22 comprising a plurality of solar panels or modules 24. Each solar module 24 comprises multiple photovoltaic solar cells 26 which are, typically, connected in series electrically. The electrical outputs of a plurality of modules, often 10 to 20, are also typically wired in series electrically as a "string" 28 (indicated by a bracket). The direct current (DC) produced by each of a plurality of strings is transmitted to a string combiner 30 which combines the energy to produce a single DC output 32. In larger installations, the respective DC outputs of a plurality of string combiners may be combined in another combiner 34 to produce a single DC output for an array. The combined energy is sent to an inverter 36 which converts the DC current to alternating current (AC) for use by AC powered electrical equipment. The power generated by the site may be transmitted to an electric power grid 38 and/or it may be consumed or stored locally in a residence, manufacturing plant or other facility 40.

The solar production of electricity is typically monitored by one or more current, voltage or power monitors. The most common form of monitoring is site-level monitoring which provides one output measurement for the entire site. A site level power meter 42 monitors the AC output of the site's inverter(s) 36. In many cases, the site level power meter 42 provides net metering by monitoring not only the output of the solar site but also the net power, the difference between the power transmitted to the power grid 38 when the solar site is producing more energy than is being used or stored locally and the power that is received from the power grid 38 when the solar site is producing less energy than the local demand. Site level monitoring satisfies a financial objective for the utility operating the power grid and the operator of the solar site but has limited usefulness in determining whether the site is operating properly and, if not, diagnosing a problem within the site's array. There are many variables that affect the overall output of a site and often these variables, such as clouds or air quality, are transient and local. As a result, it is difficult to determine, at start up, whether the site is actually producing as much energy as it should and, even after experience has been gained with the site, underperformance of the array by up to 10% is difficult to determine by monitoring the site's output at the inverter. If underperformance is suspected, the only way to isolate the problem is a costly, selective dismantling and testing of portions of the site.

An array level power meter 44 monitoring the DC output of a string combiner 30 provides insight into the operation of the arrays making up the site. If a module is damaged or defective, the output of the string of which it is an element and, as a result, the output of the string combiner 30 to which the string is connected will be reduced. Array level power meters 44 are typically connected to a monitoring and control system 46 and the average output of one array level power meter is commonly used as a reference for the other array level monitors of the site. If the current or voltage sensed by one of the array level monitors varies from the corresponding output of the reference monitor, the site operator will be alerted by the control system and troubleshooting and repair can be initiated. While array level monitoring of large sites may require more metering devices than site level monitoring, array level monitoring enables more timely recognition of problems in the site's arrays and reduces inspection and repair costs by speeding identification of an underperforming portion of the array.

By monitoring the DC current and/or voltage produced by the strings of the array, string level monitoring makes it much easier to detect and identify problems in the array; particularly where a string is underperforming or a problem with a string is intermittent. However, string level monitoring can be costly because the output of each of the large number of strings making up the array must be monitored and transducers for monitoring DC current can be expensive. The present inventors realized that while string level monitoring has many benefits, the cost can be quite high or even prohibitive. They reasoned that a cost effective string level monitoring solution required lower cost DC current transducers and a monitor construction that combined component low cost with modularity so that a string monitor could be readily adaptable to the requirements of an individual site.

Figure 2:
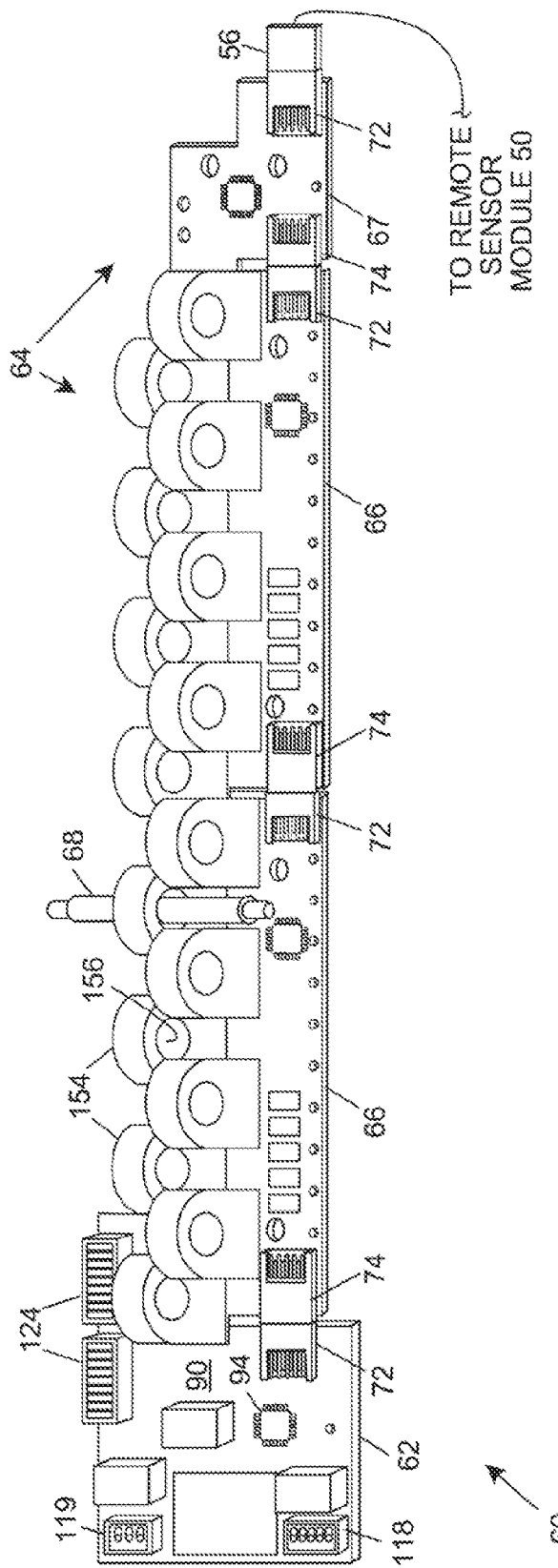
FIG. 2 is a perspective drawing of a portion of the exemplary string monitor of FIG. 1.

Referring to also FIG. 2, an exemplary string monitor 60 comprises a base unit 62 communicatively connected and supplying power to one or more sensor modules 64. The sensor modules of the exemplary string monitor 60 comprise current sensor modules 66 arranged to sense DC current in a plurality of conductors 68, each connected to one of the strings 28 of the array 22, and a single channel voltage sensor module 67 arranged to sense a single voltage at the string combiner 30. However, the string monitor could comprise sensor modules that sense current, voltage and power of each of the strings. The exemplary string monitor also includes a sensor module 50 for sensing wind speed and could include sensor modules to measure other parameters such as solar energy, temperature and air quality or sensor modules arranged to provide an analog output to operate a relay or other device.

A power bus and a data bus extending from the base unit 62 to each of the modules making up the string monitor enables transmission of power from the base unit to the sensor modules and the exchange of data and instructions between the base unit and the sensor modules. Complementary multi-pin connectors 72, 74 enable interconnection of respective portions of the power and data busses as sensor modules are added to the base unit and to each other to make up a string monitor. The base unit and sensor modules making up the exemplary string monitor 60 are preferably secured to each other by securement to a mounting structure, such as a DIN rail 48. However, one or more sensor modules, for example sensor module 50, may be physically separated from the base unit or another sensor module and connected to the remainder of the string monitor with a cable 52 having complementary connectors 54, 56 enabling connecting to the connectors 72, 74 of the base unit or another module to extend the power and data busses from the base unit to physically separated elements of the monitor.

Figure 3:
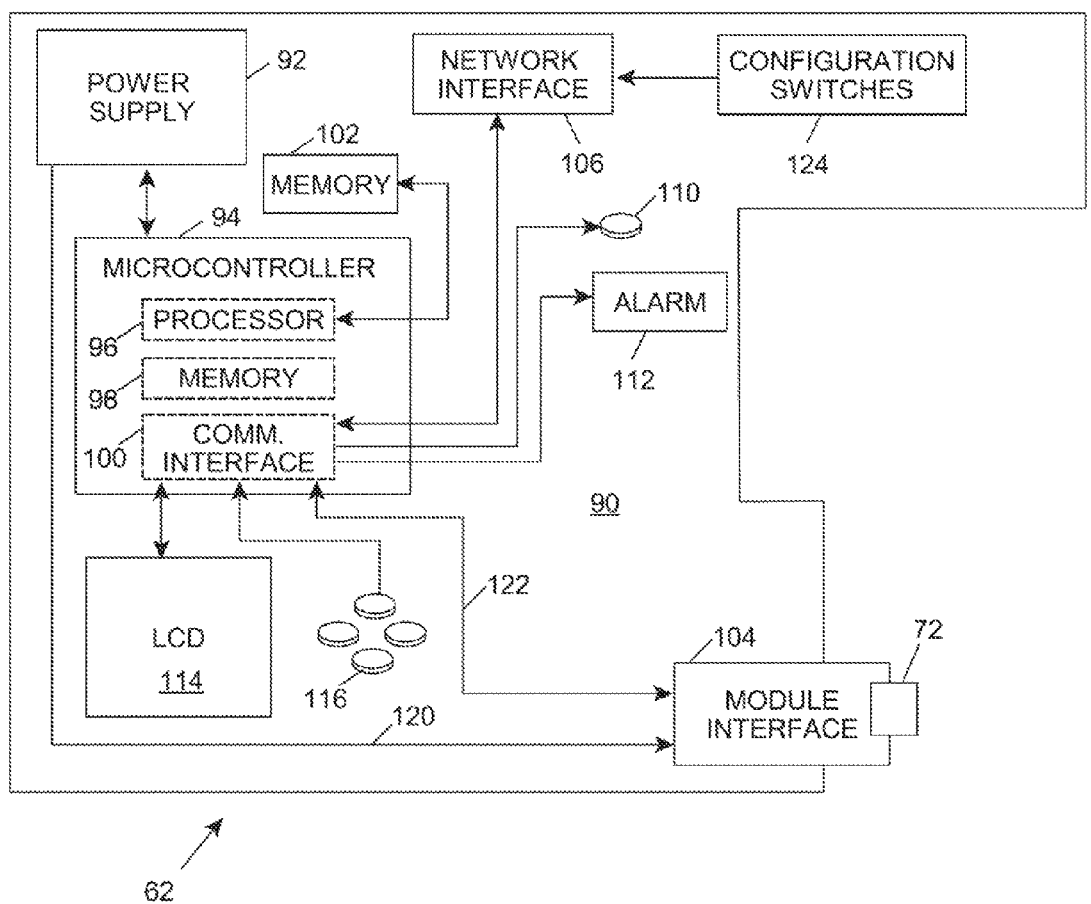
FIG. 3 is a block diagram of a base unit for the string monitor of FIG. 2.

Referring also to FIG. 3, the base unit 62 comprises a base unit circuit board 90 preferably arranged to be supported by a DIN rail 48 or other support. The base unit circuit board 90 supports a power supply 92; a microcontroller 94 which includes a processor 96, internal memory 98 and a communications interface 100; an external memory 102, a sensor module interface 104 including a multi-pin connector 72, a network interface 10 and configuration switches 108. The base unit also preferably includes a status indicator 110, such as a three color light emitting diode (LED), to indicate proper operation of the monitor, triggering of a remote alarm by the monitor, or detection of a fault in the monitor. In addition, the base unit also preferably includes an alarm contact 112 that opens or, alternatively, closes to actuate a remote alarm device when a fault has been detected in the monitor or in a circuit being monitored. The base unit may also include a user interface comprising; for example, a liquid crystal display (LCD) 114 for displaying messages and a user input device, for examples, a plurality of pushbuttons 116 or the LCD display 114 may comprise a multi-touch display, enabling a user to input responses to messages displayed on the LCD.

The base unit power supply 92 converts AC or DC power supplied to a power socket 118 to 15 v. DC which is transmitted on a power bus 120, supported by the circuit board 90, to the multi-pin connector 72 of the sensor module interface 104. The base unit power supply 92 also supplies power for operating the microcontroller 94 and other elements of the base unit.

The processor 96 of the base unit microcontroller 94 executes instructions and utilizes data stored in the internal 98 and external 102 memories to control the operation of the power supply 92, LCD 114 and alarm contact 112. In addition, the processor exchanges data and instructions with controllers of the sensor modules making up the string monitor by way of a data bus 122 supported by the circuit board 90 and connected to the multi-pin connector 72 of the sensor module interface 104. The data bus 122 and the power bus 120 are extended to a sensor module connected to the base unit by engagement of the multi-pin connector 72 of the base unit's module interface 104 with a complementary multi-pin connector 74 of the sensor module.

The network interface 106 of the base unit is arranged to exchange data and instructions with a remote site controller 46, data logger or other device through a connector 119 affixed to the base unit circuit board 90. Configuration switches 124 enable configuration of the network interface 106 for communication utilizing MODBUS RTU and BACnet communication protocols although other communication protocols such as an Ethernet protocol may be used for network communications.

Figure 4:
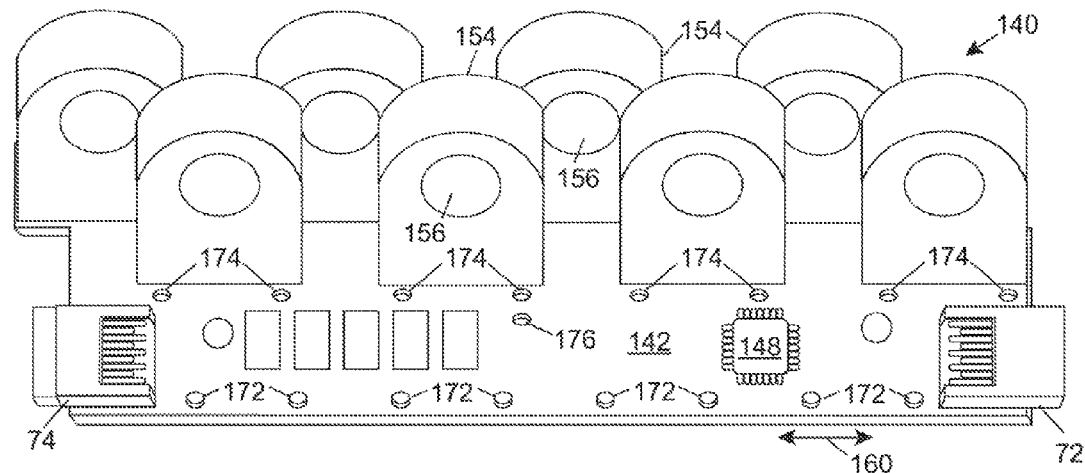
FIG. 4 is a perspective drawing of a power sensor module for a string monitor.
Figure 7:
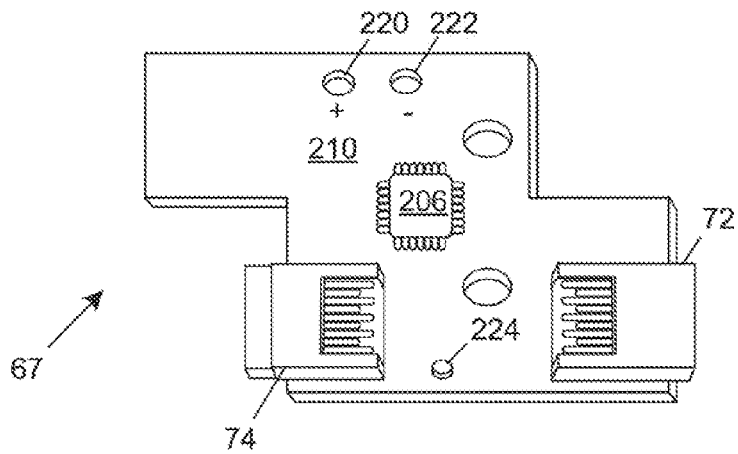
FIG. 7 is a perspective drawing of a single channel voltage sensor module for a string monitor.

Referring also to FIGS. 4 and 7, the sensor modules typically comprise a circuit board, for examples, circuit boards 140 and 210, to support the sensors and other circuit elements making up the module. Preferably the sensor modules are arranged for support by a DIN rail 48 or other support structure. Complementary multi-pin connectors 72, 74 are supported at opposing ends of the sensor module circuit boards. One multi-pin connector of the sensor module, for example multi-pin connector 74 of FIG. 4, is the complement of the multi-pin connector 72 which is attached to the base unit's circuit board. The second multi-pin connector 72 of the sensor module is the same as the multi-pin connector of the base unit, the complement of the first multi-pin connector 74 of the sensor module. When a sensor module is brought into abutment with the base unit 60 or another sensor module, the complementary multi-pin connectors 72 and 74 are engaged to extend the data bus 122 and the power bus 120 from the base unit 60 to next sensor module and from there to each of the succession of sensor modules making up the string monitor. The bidirectional data bus 122 enables data and programming instructions to be exchanged between the microcontroller 94 of the base unit 62 and a microcontroller(s) of one or more sensor modules and the power bus provides power to operate the devices of the sensor module(s) making up the string monitor.

Sensor modules typically comprise a microcontroller which is communicatively connected to the data bus 122. When the sensor module is engaged with the base unit or another sensor module connected to the base unit and power is applied to the string monitor, the microcontrollers of the respective sensor modules communicate with the microcontroller 94 of the base module providing identification of the respective sensor module and the data it will transmit to the base unit. The base unit's microcontroller responds to the sensor module with addressing and other instructions enabling the various sensor modules to communicate data to the base unit.

Figure 5:
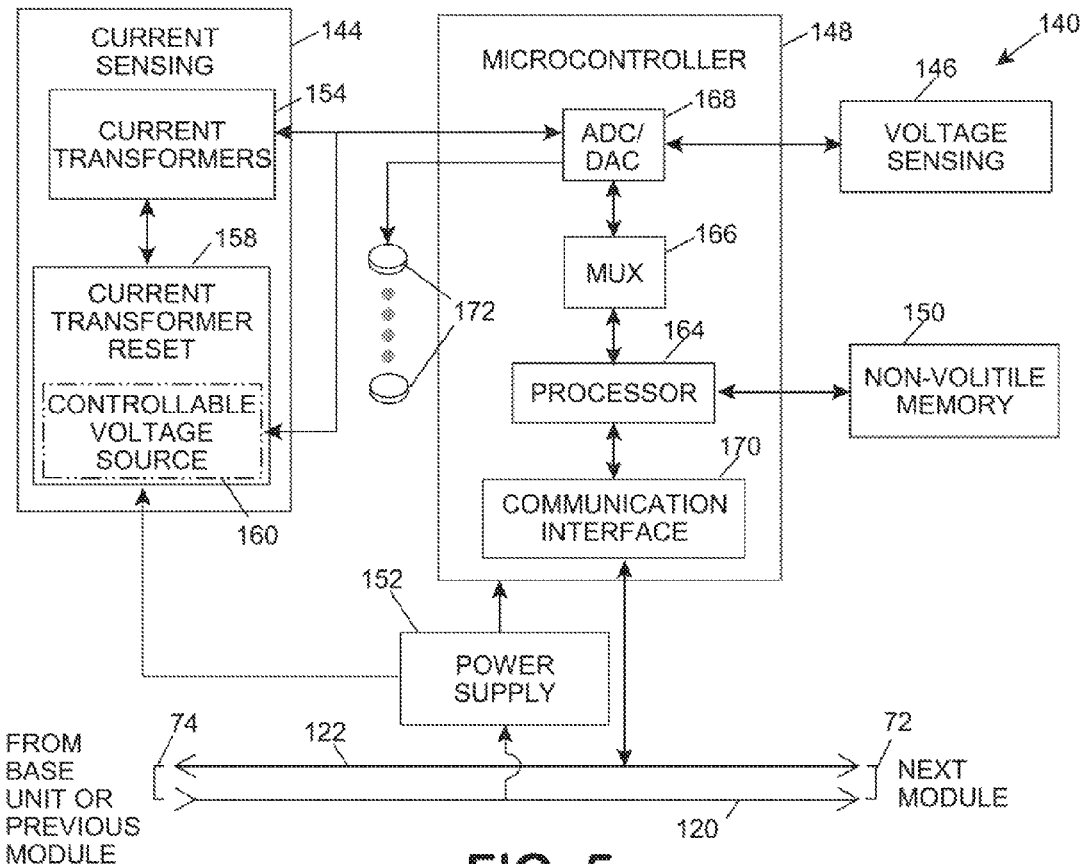
FIG. 5 is a block diagram of the power sensor module of FIG. 4.

Referring to FIGS. 4 and 5, a DC power sensor module 140 for a string monitor comprises, generally, a current sensing section 144, a voltage sensing section 146, a microcontroller 148, a power supply 152, portions of the monitor's data bus 122 and power bus 120, and a non-volatile memory 150 all supported on a circuit board 142. The sensor module memory 150 stores program instructions enabling the microcontroller 148 to operate the sensor module, to establish and maintain communication with the base unit, measure the parameters sensed by the module's transducers and calculate the module's output. The sensor module memory also stores data obtained during calibration of the module and data acquired and used during operation of the module. The sensor modules are calibrated as unitary, stand-alone devices and the calibration data for the respective sensor module is stored in the memory. When a sensor module is added to the string monitor it establishes communication with the base unit, identifies itself and receives communication instructions enabling data transmission to the base unit and is then ready to begin acquiring and transmitting data as fully calibrated device. The cost of string level monitoring is substantially reduced by avoiding the need to calibrate the string monitor when it is installed. The DC current sensor modules 66 of the exemplary string monitor 60 are substantially the same as the DC power sensor module 140, however the current sensing modules do not include a voltage sensing section.

To reduce the cost of a string monitor, the current sensing section 144 of the power and current sensor modules 140, 66 comprise a plurality of current transformers 154 which are commonly used to sense and measure alternating current. Preferably, the power or current sensor module includes eight current transformers arranged in plural rows extending along the longitudinal axis 160 of the circuit board 142. However, a power or current sensor module might include another number of current transformers, for example six current transformers. The current transformers 160 preferably comprise a wire wound on a metallic or non-metallic toroidal core enclosed in a plastic housing. The openings 156 defined by the toroidal cores of the current transformers are preferably oriented substantially parallel to each other and substantially perpendicular to a longitudinal axis 160 of the circuit board 142 and, to provide a more compact arrangement, the housings of current transformers in adjacent rows may be arranged to partially overlap in the direction of the longitudinal axis of the circuit board. The current transformers might comprise a hinged or separable housing and a split toroidal core enabling opening of a gap between the core portions so that a conductor can be located in the central opening in the toroidal core without disconnecting the conductor.

Figure 6:
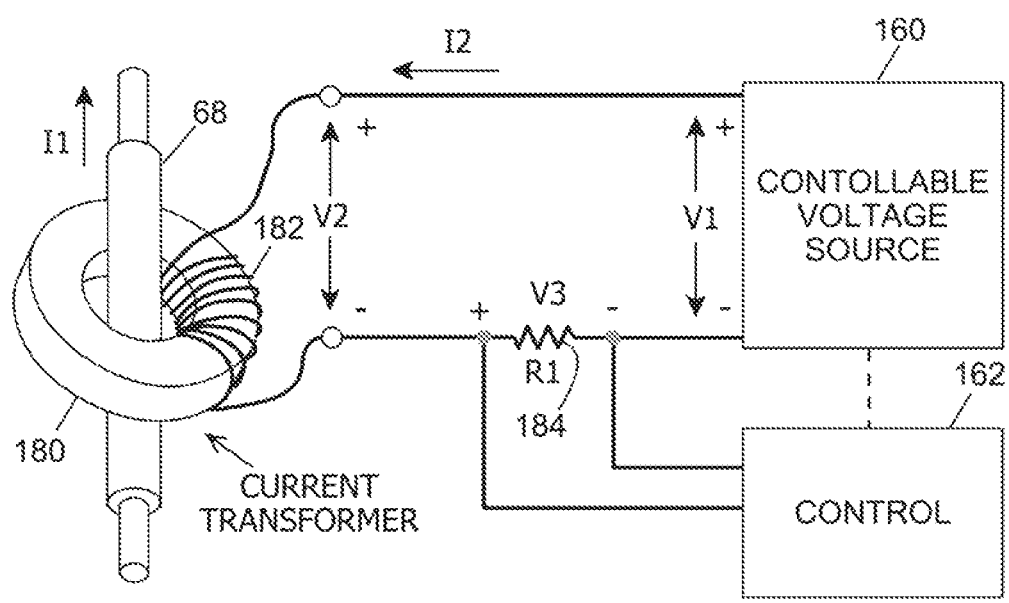
FIG. 6 is block diagram of a reset transformer.

Referring also to FIG. 6, the conductor 68 in which the current is to be measured is passed through the opening 156 defined by the toroidal core 180 of the current transformer and comprises the primary winding of the transformer. The wire 182 wound around the perimeter of the cross-section of the toroidal core comprises the transformer's secondary winding. Current transformers are relatively low cost devices and are commonly used in the above manner to sense AC current in a conductor where the changing flux produced by the alternating current induces a voltage in the secondary winding. On the other hand, a DC current in the primary winding will not induce a current in the secondary winding of a transformer because the unchanging direct current causes the core of the transformer to saturate magnetically.

However, Edel, U.S. Pat. Nos. 6,590,380 and 7,242,157 disclose a reset transformer which is arranged to sense direct current. The current transformer(s) of the DC current 64 and power 140 sensor modules include a reset section 158 comprising a controllable voltage source 160 and a voltage source control 162. The voltage source control 162 which is preferably implemented as a function of the sensor module's microcontroller 148 utilizes loop impedances for the secondary winding of the current transformer that are determined during calibration of the sensor module and stored in the memory 150 and a voltage (V3), sensed across the resistor R1 184 to control the output of the controllable voltage source 160. To prevent the core from saturating when a DC current is conducted by the primary winding, the voltage (V1) output by the controllable voltage source 160 is controlled to demagnetize the core by compensating for the secondary burden of the transformer. The output of the controllable voltage source can be a continuous voltage but is preferably a plurality of pulse width modulated voltage pulses having a time weighted value comparable to a continuous voltage that would reset the respective transformer. The processor 164 of the microcontroller 148 senses the voltage V3 and, using data quantifying the loop impedance, controls the pulsing of the controllable voltage source 160 to demagnetize the transformer's core and enable the processor to determine the magnitude of the DC current in the monitored conductor 68. The microcontroller 164 provides multiplexer (MUX) 166 functionality to periodically connect its analog-to digital/digital-to-analog converter 148 to each of the plurality of current transformers and read the respective voltage (V3) for determining the appropriate pulse rate of the controlled voltage source and the current in the monitored conductor passing through the transformer's core. The analog outputs of the current transformers are converted to digital data by an analog-to-digital converter 168 incorporated in the microcontroller 148. The microcontroller 148 calculates the current in the monitored conductor and, if applicable, the power output by the monitored string 28 and transmits the current and power data, via the microcontroller's communication interface 170 and the data bus 122 to the microcontroller 94 of the base unit for further processing and/or transmission from the base unit's network interface 106 to a remote monitoring and control system. Reset current transformers are not permanently affected by power surges in the monitored conductor and are relatively inexpensive compared to Hall effect and fluxgate transducers reducing the cost of a string monitor.

Preferably, the current and power sensor modules include a visual indicator, for example a three-color LED 172, which corresponds to each conductor being monitored and is illuminated by the sensor module's microcontroller 148 when the microcontroller detects an unexpected current or, if applicable, voltage in the monitored conductor 68. For examples, a reversal of polarity is one mode of failure of photovoltaic cells and incorrect installation of solar modules may result in a reversal of polarity of the conductor current. The polarity of the voltage (V3) in the secondary winding of the reset transformer is dependent upon the polarity of the voltage in the monitored conductor 68 and if the microcontroller senses that voltage V3 has incorrect polarity the appropriate visual indicator will be activated indicating a fault in the string monitored by the respective current sensor. A person attempting to locate a problem within the array need only to look at the visual indicators of the string monitor to determine which string is not operating correctly.

The power and current sensor modules also include a module power supply 152 connected to the power bus 120. The power supply supplies power to the controllable voltage source 160 of the reset current transformers 154 and reduces the voltage at the power bus to the correct voltage for operating the microcontroller 148 and other electronic elements of the module's circuitry.

The power sensor module 140 also includes a voltage sensing unit 146. To enable monitoring the voltage output by each monitored string, the power sensor module 140 includes a socket 174 for a lead to conductively connect the voltage sensing unit to a terminus for the respective monitored conductor and another socket 176 for a lead to connect a ground reference to the voltage sensing unit. The power sensor module's microcontroller 148 performs the multiplexer function 166 to periodically sense the current and voltage in each of the power cables being monitored by the module. Current and, if applicable, voltage and power data for the each of the strings monitored by the sensor module are transmitted by the sensor module's microcontroller 148 to the base unit's microcontroller 94 via the data bus 122.

Figure 8:
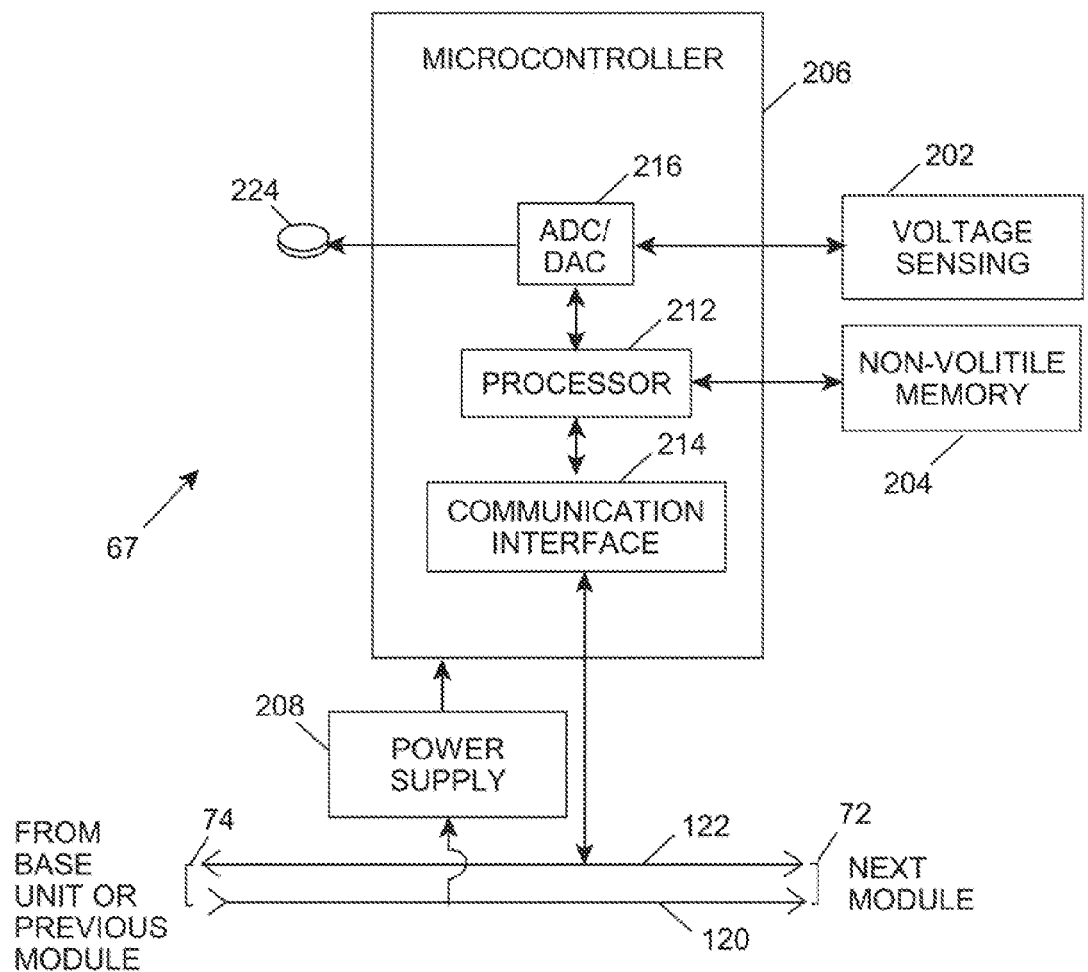
FIG. 8 is a block diagram of the single channel voltage sensor module of FIG. 7.

Referring also to FIGS. 7 and 8, the exemplary string monitor 60 also includes a single channel voltage sensor module 200. The single channel voltage sensor module 20 measures the voltage at a single point, for example a bus bar in the string combiner 30. The single channel voltage sensor module comprises a voltage sensing section 202 connectable to the a voltage source and a ground reference by leads 224, 226 engaging sockets 220, 222; non-volatile memory 204; a microcontroller 206 including a processor 212, analog-to-digital and digital-to-analog converter 216 and a communication interface 214; and a power supply 208 supported by a module circuit board 210. The circuit board 210 also supports complementary multi-pin connectors 72, 74 enabling the data bus 122 and the power bus 120 to be connected to the base unit through any previous sensor module(s) and extended to any succeeding sensor modules of the monitor. The processor 212 of the microcontroller 206 establishes communication with the base unit through a communication interface 214 connected to the data bus 122. The processor measures the voltage sensed by the voltage sensing section 202 using calibration data and programming instructions stored in the memory 204 and transmits the voltage data to the microcontroller 94 of the base unit 62. Power for the microcontroller and other electrical elements of the single channel voltage sensor module 200 is supplied by the module's power supply 208 with is connected to the power bus 120. Preferably, the single channel voltage sensor module 200 includes a status indicator 224, such as a three-color LED, operable by the microcontroller to indicate the operating status of the module or the occurrence of an unexpected voltage.

Reset current transformers for sensing DC current and modular construction reduce the cost and increase the flexibility of string monitors for monitoring DC output and other parameters particularly related to the performance of strings of solar modules making up solar arrays.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A string monitor comprising:
   (a) a base unit including;
      (i) a power supply; and
      (ii) a base unit controller arranged to communicate a datum and an instruction; and
   (b) a sensor module including;
      (i) a power bus conductively connectable to said power supply of said base unit such that a sensor module controller of said sensor module obtains its processing power for operating only from said power bus which only obtains said processing power from said power supply of said base unit;
      (ii) a data bus communicatively connectable to said base unit controller, said data bus and said power bus arranged for selective connection to a second sensor module;
      (iii) a sensor to sense at least one of a voltage at a voltage source and a direct current in a conductor; and
      (iv) said sensor module controller arranged to quantify at least one of said voltage and said direct current sensed by said sensor and communicatively connected to said data bus to exchange at least one a datum quantifying at least one of said voltage and said direct current and an instruction with said base unit controller;
      (v) said sensor module including a connector suitable to interconnect said sensor module to another sensor module to provide processing power to said another sensor module.

2. The string monitor of claim 1 wherein said sensor comprises plural current transformers each having a core demagnetized by a voltage obtained from said power bus and controlled by said sensor module controller.

3. The string monitor of claim 2 wherein said sensor module controller is arranged to periodically connect to each of said plural current transformers and quantify the current sensed by the transformer to which the controller is connected.

4. The string monitor of claim 1 wherein said base unit controller is arranged to communicate said datum to a remote data receiver.

5. The string monitor of claim 1 wherein said sensor module further comprises a first connector affixed to said sensor module and conductively connected to said data bus and said power bus, said connector engageable with a complementary base unit connector affixed to said base unit.

6. The string monitor of claim 5 wherein said sensor module further comprises a second connector affixed to said sensor module and arranged to engage a connector affixed to said second sensor module, said second connector complementary to said first connector.

7. A string monitor comprising:
   (a) a base unit including;
      (i) a base unit support;
      (ii) a first connector supported by said support;
      (iii) a power supply supported by said support;
      (iv) a power bus supported by said support and arranged to conduct electrical energy from said power supply to said first connector;
      (v) a controller supported by said support and arranged to receive and transmit at least one of a datum and an instruction; and
      (vi) a data bus supported by said support and arranged to convey at least one of a datum and an instruction between said controller and said first connector; and
   (b) at least one of sensor module comprising:
      (i) a module support;
      (ii) a module power bus supported by said module support;
      (iii) a module data bus supported by said module support;
      (iv) a second connector supported by said module support, said second connector engageable with one of said first connector and another connector similar to said first connector and arranged for transferring electrical energy between said module power bus and one of said power bus of base unit and a module power bus of a second sensor module and arranged for exchanging at least one of datum and an instruction between said module data bus and data bus of said base unit and a module data bus of said second module;
      (v) a third connector complimentary of said second connector and arranged for transferring said electrical energy from said module power bus and at least one of a datum and an instruction from said module data bus to a connector complimentary to said third connector;
      (vi) a module controller receiving electrical energy from said module power bus and communicatively connected to said module data bus to receive at least one of a datum and an instruction from said data bus and to transmit at least one of a voltage datum and a current datum to said base unit controller on said data bus, said module controller of said at least one sensor module obtains its processing power for operating only from said module power bus which only obtains said processing power from said power bus which receives its power from said power supply of said base unit; and
      (vii) at least one of:
         (a) a voltage sensor supported by said module support and connectable to a source of a voltage, said voltage sensor controlled by said module controller to sense said voltage at said source; and
         (b) plural reset current transformers supported by said module support each arranged to sense a direct current in a respective one of plural conductors;
      (viii) said sensor module including a connector suitable to interconnect said sensor module to another sensor module to provide processing power to said another sensor module.

8. The string monitor of claim 7 said at least one sensor module comprising said plural reset current transformers further comprises a controllable voltage source arranged to obtain electrical energy from said module power bus to demagnetize a core of at least one of said plural current transformers.

9. The string monitor of claim 8 wherein said controllable voltage source is controlled by said module controller to output a voltage pulse to a secondary winding of at least one of said plural current transformers.

10. The string monitor of claim 7 wherein said at least one sensor module further comprises an indicator controlled by said module controller to indicate that one of a current and a voltage of unexpected magnitude has been sensed by at least one of said voltage sensor and said plural reset current transformers.

11. The string monitor of claim 7 wherein said at least one sensor module comprising said plural reset current transformers further comprises a voltage sensor connectable to a source of a voltage for each of said plural conductors.

12. The string monitor of claim 11 wherein said at least one sensor module further comprises an indicator controlled by said module controller to indicate that one of a current and a voltage of unexpected magnitude has been sensed by at least one of said voltage sensor and said plural reset current transformers.

13. The string monitor of claim 7 wherein said base unit further comprises a network interface communicatively connected to said base unit controller and connectable to a remote data receiver.

14. The string monitor of claim 7 further comprising an indicator controlled by said controller of said base unit and arranged to indicate at least one of a proper operation of said string monitor or a faulty operation of said string monitor.

15. The string monitor of claim 7 wherein said base unit further comprises a user interface supported by said support, said user interface enabling a user input to said controller and enabling said controller to display a datum.

16. The string monitor of claim 7 wherein at least one sensor module is located distal of said base unit and includes a power bus and a data bus communicatively connected to said power bus and said data bus of base unit.

* * * * *